US010504916B2

(12) United States Patent
Huo et al.

(10) Patent No.: US 10,504,916 B2
(45) Date of Patent: Dec. 10, 2019

(54) SEMICONDUCTOR DEVICE AND METHOD OF MANUFACTURING THE SAME

(71) Applicant: INSTITUTE OF MICROELECTRONICS, CHINESE ACADEMY OF SCIENCES, Beijing (CN)

(72) Inventors: Zongliang Huo, Beijing (CN); Tianchun Ye, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 15/758,292

(22) PCT Filed: Nov. 23, 2015

(86) PCT No.: PCT/CN2015/095251
§ 371 (c)(1),
(2) Date: Mar. 7, 2018

(87) PCT Pub. No.: WO2017/041363
PCT Pub. Date: Mar. 16, 2017

(65) Prior Publication Data
US 2018/0261625 A1    Sep. 13, 2018

(30) Foreign Application Priority Data

Sep. 12, 2015 (CN) .......................... 2015 1 0580584

(51) Int. Cl.
*H01L 27/11582* (2017.01)
*H01L 21/308* (2006.01)
(Continued)

(52) U.S. Cl.
CPC .... *H01L 27/11582* (2013.01); *H01L 21/0274* (2013.01); *H01L 21/02164* (2013.01);
(Continued)

(58) Field of Classification Search
None
See application file for complete search history.

(56) References Cited

U.S. PATENT DOCUMENTS

2015/0129878 A1*  5/2015  Shin .................. H01L 27/11578
257/66

FOREIGN PATENT DOCUMENTS

| CN | 1731570 A | 2/2006 |
|---|---|---|
| CN | 103872055 A | 6/2014 |
| CN | 104022120 A | 9/2014 |

OTHER PUBLICATIONS

Chinese Office Action for related Chinese Application No. 201510580584.9; action dated Feb. 24, 2018; (3 pages).
(Continued)

*Primary Examiner* — Zandra V Smith
*Assistant Examiner* — Lawrence C Tynes, Jr.
(74) *Attorney, Agent, or Firm* — K&L Gates LLP

(57) ABSTRACT

A three-dimensional memory device and method of manufacturing the same, an isolation structure is embedded between the common source region and the substrate thereunder, which can inhibit the undesired diffusion of impurities during the implantation of the common source region, avoiding operation failure due to excessive diffusion of impurities. In programming and reading states of the three-dimensional memory device, electrons flow from the common source region to bit line; while in erase states, holes are injected from the substrate. Due to the isolation structure, the three-dimensional memory device achieves spatial separation of electrons from holes required for programming/
(Continued)

erasing, improving the erasing efficiency and the integration as well.

9 Claims, 6 Drawing Sheets

(51) Int. Cl.
    *H01L 21/306*     (2006.01)
    *H01L 21/762*     (2006.01)
    *H01L 21/02*     (2006.01)
    *H01L 21/027*     (2006.01)
    *H01L 21/311*     (2006.01)
    *H01L 29/10*     (2006.01)
    *H01L 21/28*     (2006.01)
    *H01L 29/792*     (2006.01)
    *H01L 29/66*     (2006.01)

(52) U.S. Cl.
    CPC ...... *H01L 21/02532* (2013.01); *H01L 21/308* (2013.01); *H01L 21/30604* (2013.01); *H01L 21/31111* (2013.01); *H01L 21/762* (2013.01); *H01L 21/76224* (2013.01); *H01L 29/1037* (2013.01); *H01L 29/40117* (2019.08); *H01L 29/7926* (2013.01); *H01L 21/02592* (2013.01); *H01L 21/02595* (2013.01); *H01L 21/02636* (2013.01); *H01L 29/66545* (2013.01); *H01L 29/66833* (2013.01)

(56) References Cited

OTHER PUBLICATIONS

Chinese Office Action for related Chinese Application No. 201510580584.9; action dated Jun. 28, 2017; (4 pages).
International Search Report for related International Application No. PCT/CN2015/095251; report dated Jun. 3, 2016; (6 pages).

* cited by examiner

SEMICONDUCTOR DEVICE AND METHOD OF MANUFACTURING THE SAME

CROSS-REFERENCE TO RELATED APPLICATIONS

The present application is a National Stage of International Application No. PCT/CN2015/095251, filed Nov. 23, 2015, which claims priority to Chinese Application No. 201510580584.9, filed Sep. 12, 2015, the disclosures of which are incorporated herein by reference.

TECHNICAL FIELD

The present invention relates to field of semiconductor devices and methods of making the same, and in particular, to a three-dimensional memory device and method of making the same.

TECHNICAL BACKGROUND

With the progress of the times and the development of the society, the function of semiconductor memory device is more and more important in the human society. At the same time, people have higher requirements on semiconductor memory performance, cost and so on. Due to the development of semiconductor technologies and processes, semiconductor memories with vertical channel transistors have been developed and successfully used in the industry. Such memory devices are often referred to as three-dimensional memory devices. Compared with the previous memory devices with only planar channel transistors, the three-dimensional memory device can obtain more storage nodes in the same chip area, thereby increasing the integration of the memory device and reducing the cost.

Considering the continuous scaling shrink of semiconductor process feature sizes, the process and structure for forming three-dimensional memory devices are faced with many challenges. One of the notable problems is that, referring to FIG. 13, in the illustrated three-dimensional memory structure, a lower select transistor 21 consists of an L-type SEG (Selective Epitaxial Growth) transistor including two segments of channel lengths L1 and L2. In the high-density integration process, it is necessary to reduce the width of the gate electrode and to further reduce the aperture. However, the high-temperature process in the fabrication of the memory device may make undesirable diffusion during the implantation of the common source region 22, as shown by the dotted line in FIG. 13, resulting in a pinch-off in the N+ region under the channel hole 23, making it difficult to batch erase the hole of the substrate 24.

Therefore, there is a need to provide a novel three-dimensional memory device and a method of manufacturing the same to overcome the above drawbacks of the prior art.

SUMMARY OF THE INVENTION

The present invention provides a novel three-dimensional memory device and a method of manufacturing the same, which adopts a method of forming an isolation structure between a common source region and a substrate, overcoming the storage operation failure problem caused by the diffusion of a common source region existing in the prior art.

The present invention provides a method of manufacturing a semiconductor device for manufacturing a three-dimensional memory device including the steps of:

providing a substrate, forming a patterned first mask layer on the substrate and etching the substrate with the first mask layer;

forming an isolation structure on the exposed substrate after etching;

removing the patterned first mask layer;

growing a semiconductor material using an epitaxial or deposition process to completely cover the isolation structure, and performing a planarization process;

alternately depositing a silicon dioxide layer and a gate structure layer for a plurality of times to form a multi-layer dielectric film;

forming a vertical channel region in the multi-layer dielectric film by photolithography and etching processes, at the bottom of which the semiconductor material grown by the epitaxial or deposition process is exposed, wherein at least one portion between the substrate and the part directly under the vertical channel region is not isolated by the isolation structure;

forming a gate dielectric layer, a vertical channel layer and a channel isolation layer in the vertical channel region;

etching the multi-layer dielectric film until reaching the semiconductor material grown by epitaxial or deposition processes, and performing implantation to form a common source region, at least one portion directly under the common source region and between the substrate is isolated by the isolation structure;

forming isolation spacers, electrode leads and the bit lines.

According to one aspect of the present invention, the isolation structure is formed of silicon dioxide and has an L-shaped structure.

According to one aspect of the present invention, a gate-first process is used and the gate structure layer is a gate layer; or a gate-last process is used and the gate structure layer is a dummy gate layer.

According to one aspect of the present invention, the gate dielectric layer comprises a tunneling layer, a storage layer, and a barrier layer, wherein the tunneling layer is formed of SiO2, SiON, Si3N4 or high-K material, and has a single layer or multi-layer structure; the storage layer is made of material with charge trapping capability, including Si3N4, SiON, HfO2, Al2O3, AlN, and has a single layer or multi-layer structure; the barrier layer is formed of SiO2, Al2O3, HfO2, and has a single layer or multi-layer structure.

According to one aspect of the present invention, the material of the vertical channel layer is a-Si, polySi, or SiGe.

According to one aspect of the present invention, the gate layer is of polysilicon, silicide, metal or metal nitride, and has a multi-layer structure or a single-layer structure.

According to one aspect of the present invention, the vertical channel region has a structure of a pillar, a hollow ring, or a core-shell structure filled with a hollow ring and an insulating layer.

The present invention also provides a semiconductor device, comprising a three-dimensional memory device, comprising:

a substrate;

an isolation structure layer in the substrate;

a multi-layer dielectric film comprising alternately stacked silicon dioxide layers and gate structure layers;

a vertical channel region in the multi-layer dielectric film, at the bottom of which a semiconductor material is exposed, wherein at least one portion between the substrate and the part directly under the vertical channel region is not isolated by the isolation structure;

a gate dielectric layer, a vertical channel layer and a channel isolation layer in the vertical channel region;

a common source region in the substrate, at least one portion between the substrate and the part directly under the common source region is isolated by the isolation structure;

isolation spacers, and respective electrode leads.

According to one aspect of the present invention, the gate dielectric layer in the vertical channel region is straight-line shaped or L-shaped.

An advantage of the present invention lies in that an isolation structure is embedded between the common source region and the substrate thereunder, which can inhibit the undesired diffusion of impurities during the implantation of the common source region and avoid the operation failure caused by the over-diffusion of impurities. In programming and reading states of the three-dimensional memory device, electrons flow from the common source region to the bit line, while in erase state holes are injected from the substrate. Due to the isolation structure, the three-dimensional memory device realized separation of electrons and holes in space required in programming/erase state, improving the efficiency of erasing/writing and the integration as well.

DETAILED DESCRIPTION

Figure 1:
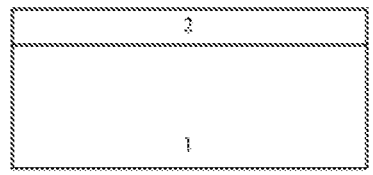
FIGS. 1-12 are schematic flow charts of a semiconductor manufacturing method and schematic structural diagrams of a semiconductor device according to present invention.

The present invention is described below by means of the specific embodiments shown in the drawings. It should be understood, however, that these descriptions are merely exemplary and are not intended to limit the scope of the present invention. In addition, in the following description, descriptions of well-known structures and techniques are omitted to avoid unnecessarily obscuring the concepts of the present invention.

The present invention provides a semiconductor device and a method of manufacturing the same, and more particularly to a three-dimensional memory device and a method of manufacturing the same. The method of manufacturing a semiconductor device provided by the present invention will be described in detail below with reference to the accompanying drawings.

First, referring to FIG. 1, a substrate 1 is provided, and a first mask layer 2 is formed on the substrate 1. The semiconductor substrate 1 can be selected according to the needs and use of the device, including but not limited to bulk silicon substrate, SOI substrate, germanium substrate, germanium silicon (SiGe) substrate, compound semiconductor material such as Gallium Nitride (GaN), Gallium arsenide (GaAs), Indium Phosphide (InP) and the like. For compatibility with the conventional CMOS process, the semiconductor substrate 1 in this embodiment preferably uses a bulk silicon substrate, for example, a P-type silicon substrate. The first mask layer 2 can use material of SiON, $Si_3N_4$ or the like.

Figure 2:
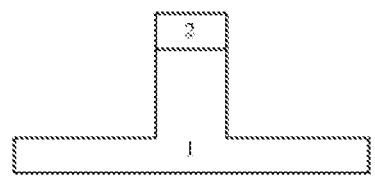
Figure 3:
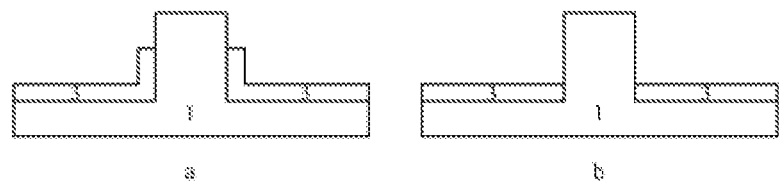

Next, referring to FIG. 2, the first mask layer 2 is patterned to form a patterned first mask layer 2 on the substrate 1, and then the substrate 1 is etched using the patterned first mask layer 2. After that, referring to FIG. 3, an isolation structure 3 is formed on the exposed substrate 1 after etching, wherein the isolation structure 3 is preferably L-shaped, as shown in FIG. 3(a). Alternatively, the isolation structure 3 may be formed in a straight line only on the horizontal plane of the substrate 1 (see FIG. 3(b)). The process of forming the isolation structure 3 includes, but is not limited to, depositing silicon dioxide. The material of the isolation structure 3 should be suitable for blocking the diffusion of impurities in subsequent source regions. Then, the first mask layer 2 is removed.

Figure 4:
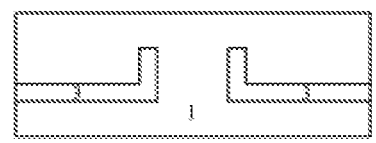

Referring to FIG. 4, a semiconductor material is epitaxially grown or deposited to completely cover the isolation structure 3, and then planarized. Specifically, single crystal silicon, SiGe, or the like may be grown by epitaxial methods, or a semiconductor material such as polysilicon may be deposited. The semiconductor material formed in this step is used to form a common source region, a horizontal channel region, and the like in subsequent processes. Since it is of also semiconductor material like the substrate 1 with same function, no delineation is shown in the drawings, neither new epitaxial semiconductor materials are given any new reference numerals.

Figure 5:
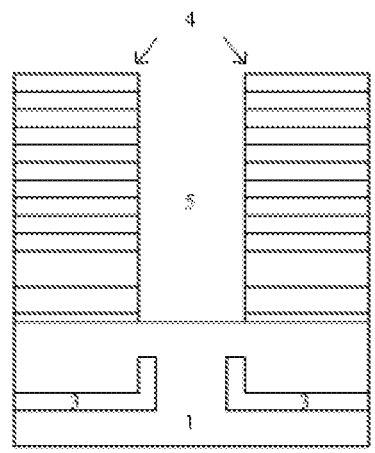

Next, referring to FIG. 5, firstly, a plurality of silicon dioxide layers and a plurality of gate structure layers are alternately deposited for a plurality of times to form a multi-layer dielectric film 4; next, a vertical channel region 5 is formed in the multi-layer dielectric film 4 by photolithography and etching process, exposing the semiconductor material grown by epitaxial or deposition processes at bottom of the vertical channel region 5. And at least one portion between the substrate 1 and the part directly under the vertical channel region 5 is not isolated by the isolation structure 3.

The multi-layer dielectric film 4 is a stacked layer formed by alternately stacking a silicon oxide layer and a gate structure layer, of which the layer adjacent to the substrate 1 is a silicon dioxide layer. If gate first process is used, the gate structure layer in the multi-layer dielectric film 4 will be the gate layer of the final memory device. The material of the gate layer is polysilicon, silicide, metal or metal nitride, for example, Tungsten (W), TaN, etc. It can also include a metal barrier layer such as tungsten nitride (WN). The gate layer may be formed to a multi-layer or single-layer structure by these materials. If gate last process is used, the gate structure layer in the multi-layer dielectric film 4 will be a dummy gate layer, for example, SiON and $Si_3N_4$ layer, which will be removed in subsequent processes. In the present embodiment, the gate last process is employed, and the subsequent process is also based on the gate last process. In an alternative embodiment, a gate first process may be employed.

The shape of the vertical channel region 5 includes, but is not limited to, pillar-shaped, columnar, rhombus-shaped, semicylindrical, etc. pillar-like, or hollow-core, hollow ring- and insulator-filled core-shell structures that depend on the needs of the particular device.

Figure 6:
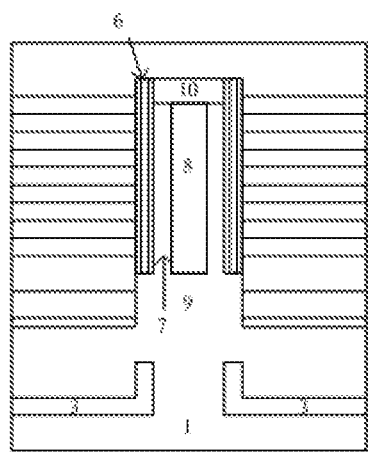

Next, referring to FIG. 6, a gate dielectric layer 6, a vertical channel layer 7 and a channel isolation layer 8 are formed in the vertical channel region 5.

The gate dielectric layer 6 further includes a tunneling layer, a storage layer, and a barrier layer (none of the reference numbers are given). The tunneling layer is made of high-K material such as $SiO_2$, SiON, $HfO_2$ and $Al_2O_3$, and may have a single-layer or multi-layer structure. The material of the storage layer is the one with charge trapping capability such as $Si_3N_4$, SiON, $HfO_2$, $Al_2O_3$, AlN, etc., may also have a single layer or multi-layer structure; the barrier layer is made of $SiO_2$, $Al_2O_3$, $HfO_2$ or other dielectric materials, and has a single layer or multi-layer structure. The material of the vertical channel layer 7 is amorphous Si, poly-Si, or SiGe, etc., and the channel isolation layer 8 is SiO$_2$, Si$_3$N$_4$, airgap, SiGe and the like.

Figure 12:
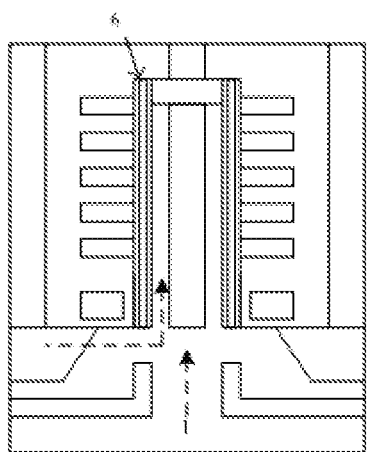
Figure 13:
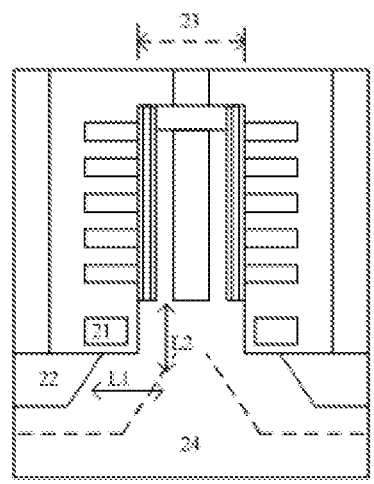
FIG. 13 is a schematic of prior art.

An epitaxial semiconductor region 9 may be formed at the vertical channel of the lower select transistor by selective epitaxial growth (SEG) method before forming the gate dielectric layer 6, the vertical channel layer 7 and the channel isolation layer 8 in the vertical channel region 5. The present embodiment is based on the existence of the SEG epitaxial semiconductor region 9; in an alternative embodiment, the SEG may not be performed, that is, the lower selection transistor does not have a vertical channel, for example, as shown in FIG. 12.

After the gate dielectric layer 6, the vertical channel layer 7 and the channel isolation layer 8 are formed, back etching and filling of the bit line contact region 10 can be performed, the filled material includes conductive materials such as amorphous Si, poly-Si, SiGe or metal, etc.

Figure 7:
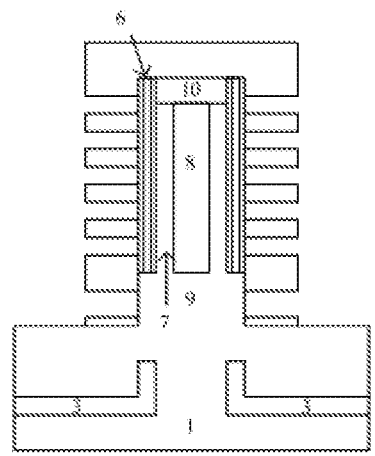
Figure 8:
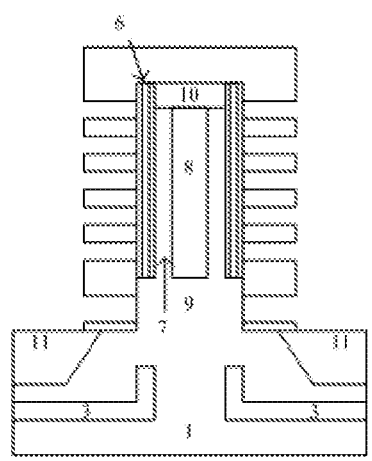

Next please refer to FIGS. 7 and 8, the multi-layer dielectric film 4 is etched using a mask until reaching the semiconductor material grown by epitaxial or deposition processes, and then performing implantation to form a common source region 11. At least one portion between the substrate 1 and the part directly under the common source region 11 is isolated by the isolation structure 3. In FIG. 7, the substrate of the semiconductor material exposed by etching is just the position required to form the common source region 11. Meanwhile, in the present embodiment, since the gate last process is used, a plurality of dummy gate layers are removed after etching process to form spaces for containing the subsequent gate layers.

Referring to FIG. 8, during the implantation of the common source region 11, since the substrate adopts P-type material in this embodiment, the impurity type of the common source region 11 is N+ type. In the present invention, the isolation structure 3, particularly the L-shaped isolation structure 3, is embedded between the common source region 11 and the substrate under the same, so as to suppress the undesired diffusion of impurities during the implantation of the common source region. Control of impurities in the common source region avoids operational failure due to excessive diffusion of impurities, for example, erasing hole body failure. In this way, the isolation structure 3 achieves spatial separation of N-type region from P-type region. Specifically, in this embodiment, the P-type substrate is separated from the N+type common source region.

Figure 9:
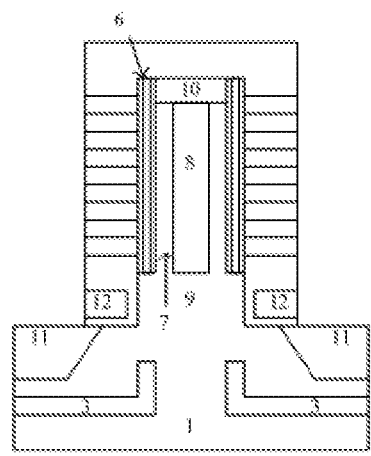

In the gate last process of this embodiment, referring to FIG. 9, after forming the common source region, filling of the gate electrode is performed, for example, TiN, W or the like is used to form respective gate electrodes including the lower select transistor gate 12. Prior to the gate electrode filling, a gate dielectric layer of the lower selection transistor gate 12 corresponding to the vertical direction channel is preferentially formed, for example, an oxidation process is used. In an alternative embodiment, the silicon dioxide material in the multi-layer dielectric film 4 may be removed firstly before removing the dummy gate layer. After removing the dummy gate layer, the entire gate dielectric layer 6 or a portion of it may be filled by a deposition method after removing the dummy gate layer, and then the gate electrode may be filled. The formation of the gate electrode and the gate dielectric layer in the gate last process may be set at a suitable position in the process flow after the common source region is etched according to specific requirements.

Figure 10:
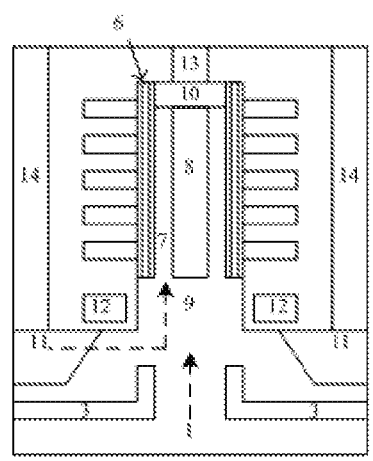

Referring to FIG. 10, an insulating dielectric is deposited to form isolation spacers, and then a metal material, such as W, is deposited to form respective electrode leads 14 of the common source regions and the bit lines 13. Thus, the manufacturing of the three-dimensional memory device is completed. In programming and reading states of the three-dimensional memory device, electrons flow from the common source region 11 to the bit line through horizontal and vertical channels as indicated by the L-shaped dotted arrow in FIG. 10; while in erase states, holes are injected from the substrate as shown by the straight-line dotted arrow in FIG. 10. Thus due to the isolation structure, the three-dimensional memory device achieves spatial separation of electrons from holes required for programming/erasing, improving the erasing efficiency and the integration as well.

Figure 11:
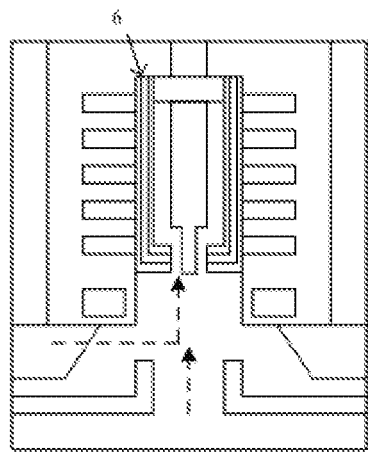

In an alternative embodiment, referring to FIG. 11, the gate dielectric layer 6 in the vertical channel region 5 is formed into an L-shape. Alternatively, referring to FIG. 12, the SEG epitaxial process of semiconductor region 9 is not performed at bottom of the vertical channel region 5, ie, the lower select transistor does not include a vertical direction channel, but has only a horizontal direction channel.

Accordingly, the present invention also provides a semiconductor device, comprising a three-dimensional memory device, specifically comprising: a substrate 1; an isolation structure 3 located in the substrate; a multilayer dielectric film 4 comprising alternately stacked silicon dioxide layers and gate structure layers; a vertical channel region 5 located in the multi-layer dielectric film 4 with the bottom of the vertical channel region 5 exposing the semiconductor material, wherein at least one portion between the substrate 1 and the part directly under the vertical channel region 5 is not isolated by the isolation structure 3; a gate dielectric layer 6, a vertical channel layer 7 and a channel isolation layer 8 located in the vertical channel region 5; a common source region 11 located in the substrate 1, wherein at least one portion between the substrate 1 and the part directly under the common source region 11 is isolated by the isolation structure 3; the spacers; and the respective electrode leads 14 and the bit line 13.

Wherein the substrate 1 comprises an epitaxial semiconductor material layer above the substrate 1.

In an alternative embodiment, the gate dielectric layer 6 located in the vertical channel region 5 is straight-line shaped (see FIG. 10) or L-shaped (see FIG. 11); thus, in an alternative embodiment, the lower select transistor may have an epitaxial channel portion 9 in the vertical channel direction, or no epitaxial channel portion (see FIG. 12).

In the above, the semiconductor device of the present invention and the method of manufacturing the same have been described. In the method of the present invention, an isolation structure is embedded between the common source region and the substrate thereunder, which can inhibit the undesired diffusion of impurities during the implantation of the common source region, avoiding operation failure due to excessive diffusion of impurities. In programming and reading states of the three-dimensional memory device, electrons flow from the common source region to bit line; while in erase states, holes are injected from the substrate. Due to the isolation structure, the three-dimensional memory device achieves spatial separation of electrons from holes required for programming/erasing, improving the erasing efficiency and the integration as well.

Although the present invention has been described with reference to one or more exemplary embodiments, those skilled in the art will recognize that various suitable changes and equivalents to the device structure and/or process flow may be made without departing from the scope of the invention. In addition, many modifications may be made to adapt a particular situation or material to the teachings of the disclosure without departing from the scope of the invention. Therefore, it is intended that the invention not be limited to the particular embodiments disclosed as the best mode contemplated for carrying out this invention, the disclosed device structures and methods of manufacture will include all embodiments falling within the scope of the invention.

What is claimed is that:

1. A method of manufacturing a semiconductor device for manufacturing a three-dimensional memory device, comprising the steps of:

provide a substrate, forming a patterned first mask layer on the substrate and etching the substrate with the first mask layer;

forming an isolation structure on the exposed substrate after etching;

removing the patterned first mask layer;

growing a semiconductor material using an epitaxial or deposition process to completely cover the isolation structure, and performing a planarization process;

alternately depositing a silicon dioxide layer and a gate structure layer for a plurality of times to form a multi-layer dielectric film;

forming a vertical channel region in the multi-layer dielectric film by photolithography and etching processes, at the bottom of which the semiconductor material grown by epitaxial or deposition process is exposed, wherein at least one portion between the substrate and the part directly under the vertical channel region is not isolated by the isolation structure;

forming a gate dielectric layer, a vertical channel layer and a channel isolation layer in the vertical channel region;

etching the multi-layer dielectric film until reaching the semiconductor material grown by epitaxial or deposition processes, and performing implantation to form a common source region, wherein at least one portion between the substrate and the part directly under the common source region is isolated by the isolation structure; and forming isolation spacers, contacts of the common source region, and bit lines.

2. The method according to claim 1, wherein the isolation structure is formed of silicon dioxide and has an L-shaped structure.

3. The method according to claim 1, wherein a gate-first process is used and the gate structure layer is a gate layer; or a gate-last process is used and the gate structure layer is a dummy gate layer.

4. The method according to claim 3, wherein the gate layer is of polysilicon, a silicide, metal or metal nitride, and has a multi-layer structure or a single-layer structure.

5. The method of claim 1, wherein the gate dielectric layer comprises a tunneling layer, a storage layer, and a barrier layer, wherein the tunneling layer is formed of $SiO_2$, SiON, $Si_3N_4$ or high-K material, and has a single layer or multi-layer structure; the storage layer is formed of material with charge trapping capability, including $Si_3N_4$, SiON, $HfO_2$, $Al_2O_3$, AlN, and has a single layer or multi-layer structure; and the barrier layer is formed of material $SiO_2$, $Al_2O_3$, $HfO_2$, and has a single layer or multi-layer structure.

6. The method according to claim 1, wherein the material of the vertical channel layer is a-Si, polySi, or SiGe.

7. The method of claim 1, wherein the vertical channel region has a structure of a pillar, a hollow ring, or a core-shell structure filled with a hollow ring and an insulating layer.

8. The method of claim 1, wherein the isolation spacers are formed by depositing an insulating dielectric material.

9. The method of claim 1, wherein the contacts of the common source region and the bit lines are formed by depositing a metal material.

* * * * *